United States Patent [19]

Engeler et al.

[11] 4,178,519
[45] Dec. 11, 1979

[54] INPUT CIRCUIT FOR CHARGE TRANSFER APPARATUS

[75] Inventors: William E. Engeler; Richard D. Baertsch, both of Scotia, N.Y.

[73] Assignee: General Electric Company, Schenectady, N.Y.

[21] Appl. No.: 934,011

[22] Filed: Aug. 16, 1978

[51] Int. Cl.$^2$ .................. G11C 19/28; H01L 29/78; H01L 27/02

[52] U.S. Cl. .................. 307/221 D; 357/24; 357/51

[58] Field of Search .................. 357/24; 307/221 D

[56] References Cited

U.S. PATENT DOCUMENTS 3,986,198  10/1976  Kosonocky .................. 357/24

4,040,077  8/1977  Tehon .

FOREIGN PATENT DOCUMENTS 976662  10/1975  Canada .................. 357/24

OTHER PUBLICATIONS

McCaughan et al., "Phase-Referred Input: A Simple New Linear CCD Input Method", Electronics Letters, vol. 12 (12/76), p. 682.

Primary Examiner—Gene M. Munson
Attorney, Agent, or Firm—Julius J. Zaskalicky; Joseph T. Cohen; Marvin Snyder

[57] ABSTRACT

Input structures are described for sampling an analog signal and providing charge samples in accordance therewith to charge transfer devices.

6 Claims, 8 Drawing Figures

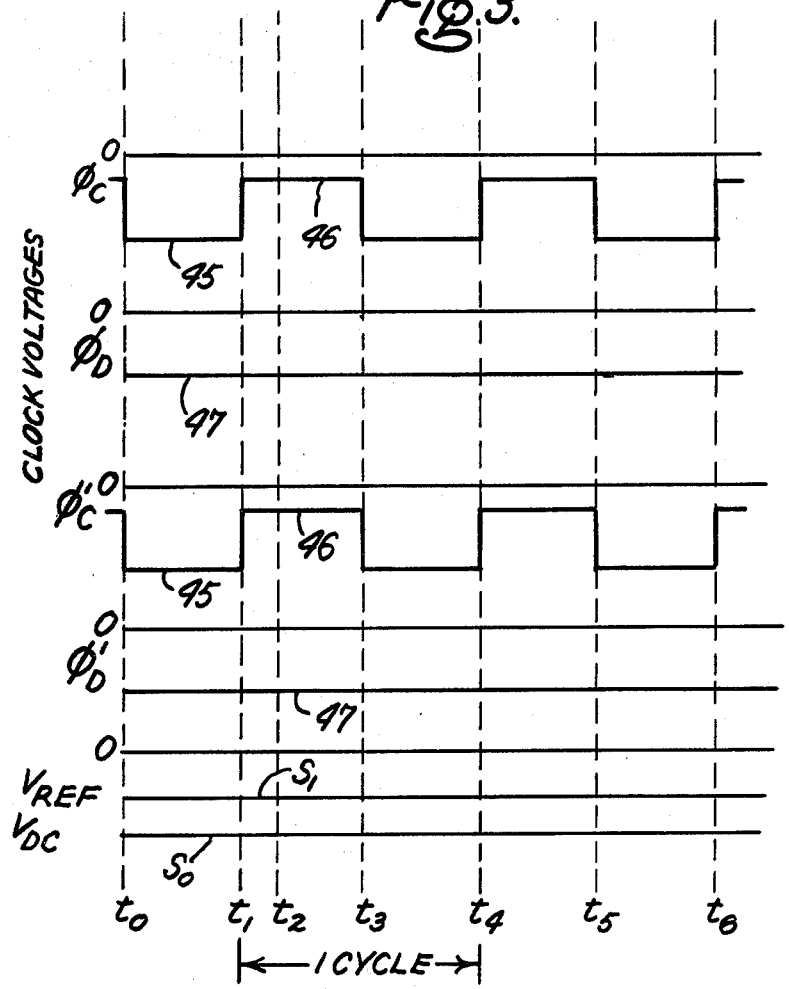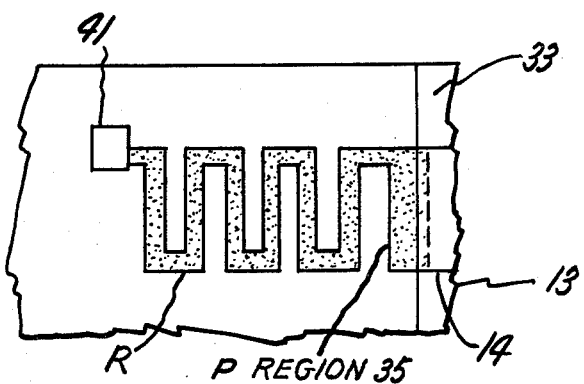

INPUT CIRCUIT FOR CHARGE TRANSFER APPARATUS

This invention relates in general to charge transfer apparatus, and in particular relates to circuits for converting a signal into packets of charge corresponding to samples of the signal.

One commonly used and highly advantageous class of circuits for effecting the conversion of an analog signal into charge samples or packets are circuits referred to as "fill and spill" input circuits. In basic structure, this class of circuits includes a storage region in a semiconductor substrate of one conductivity type and a source of mobile charge separated from the storage region by a barrier region. The source of mobile charge may comprise a region of opposite conductivity type in the substrate. The surface potential of the storage region is set by an analog signal applied to an electrode insulatingly overlying the storage region. The barrier region is provided with a reference potential established by applying a reference voltage to a reference electrode insulatingly overlying the barrier region. During a first part of a sampling cycle, an input charging pulse is applied to the source of mobile charge to raise the potential thereof and cause charge to flow from the source through the barrier region into the storage region filling the latter with charge. During a second part of the sampling cycle, the potential of the charge source is lowered below the potential of the barrier region and excess charge in the storage region spills over the potential barrier of the barrier region into the source region until the potential of the storage region equilibrates with the potential of the barrier region. During a third portion of the cycle, the charge packet or sample formed in the storage region is transferred to another adjacent storage of the charge transfer apparatus for further processing in the charge transfer apparatus.

Typically, in the operation of such "fill and spill" circuits clocking pulses or waveforms are utilized which are different from the clocking waveforms of the main section of charge transfer apparatus. At low frequency, a properly timed waveform may be generated and applied to the input section to obtain the operation desired. However, at higher frequencies, the specially generated and timed waveform for the input section becomes more difficult to generate. One solution which has been proposed is the use of one of the clocking waveforms of the main section of the charge transfer apparatus for the input section as well. Such a solution is described in an article entitled "Phase-Referred Input: A Simple New Linear C.C.D. Input Method" by D. V. McCaughan and J. G. Harp in *Electronics Letters*, Dec. 9, 1976, Vol. 12, No. 25, p. 682. In such a case as this, the spill time or second part of a sampling cycle will be determined by the fall time of the clocking waveform. That is, in the example described above, the spilling of charge from the storage region occurs as the clocking waveform drops in potential thereby dropping the potential of the charge source and also dropping the potential in the adjacent storage region of the charge transfer apparatus. As the clocking voltage is connected directly to the charge source and the clocking voltage is connected to the electrode controlling the adjacent storage region, the potential of the charge source falls below the potential of the reference barrier prior to the dropping in potential of the adjacent storage region to a value enabling transfer of the sample packet of charge thereto. Accordingly, if the fall time of the clocking waveform is long enough, sufficient time exists for performing the spill part of the cycle. However, when high frequency clocking waveforms are utilized, such fall times are not long enough for the spilling of excess charge and hence for accurate sampling of the analog signal.

The present invention is directed to overcoming disadvantages and limitations, such as mentioned above, in sampling circuits for charge transfer apparatus.

An object of the present invention is to provide improvements in linear input sampling circuits for charge transfer apparatus.

Another object of the present invention is to provide linear input sampling circuits for charge transfer apparatus which are useful at high frequencies.

A further object of the present invention is to provide charge transfer apparatus including analog sampling circuits which utilizes a single clock pulse for providing the functions charge input, charge transfer and charge output.

In carrying out the invention in one illustrative embodiment thereof, there is provided a substrate of semiconductor material having a major surface and of one conductivity type. A first electrode is provided insulatingly overlying a first region of the substrate adjacent the major surface. A second electrode is provided insulatingly overlying a second region of the substrate adjacent the major surface with the second region being contiguous to the first region. A third electrode is provided insulatingly overlying a third region of the substrate adjacent the major surface and contiguous to the second region. A fourth electrode is provided insulatingly overlying a fourth region of the substrate adjacent the major surface and contiguous to the fourth region. A fifth electrode is provided insulatingly overlying a fifth region of the substrate adjacent the major surface with the fifth region being contiguous to the first region. A region of opposite conductivity type is provided in the major surface of the substrate having a portion adjacent to the fifth region. A reference voltage is applied to the first electrode to deplete the first region and to establish a surface potential therein corresponding to the reference voltage. A signal voltage is applied to the second electrode to deplete the second region and to establish a surface potential therein corresponding to the signal voltage. A first clock voltage is applied to the third electrode to deplete the third region and to establish a surface potential therein corresponding to the first clock voltage. A second clock voltage is applied to the fourth electrode to deplete the fourth region and to establish a surface region therein corresponding to the second clock voltage. The second clock voltage has a first value over a first portion of a cycle thereof which is unfavorable for the transfer of charge from the second region to the fourth region and having a second value over a second portion over the cycle which is favorable for the transfer of charge from the second region to the fourth region. The first clock voltage has a first value during the aforementioned first portion of the cycle of the second clock voltage which inhibits the transfer of charge from the second region to the fourth region and has a second value during the aforementioned second portion of the cycle of the second clock voltage which enables the transfer of charge from the second region to said fourth region. The portion of the region of opposite conductivity type adjacent to the fifth region is connected through a resistance to a source of potential to provide a surface potential therein of a value unfavorable for the transfer of charge therefrom to the first region.

Circuit means are provided for applying the second clock voltage to the fifth electrode to provide a surface potential in the fifth region and the adjacent portion of the region of opposite conductivity type during the aforementioned first portion of the cycle of the second clock voltage energetically favorable for the flow of charge from the fifth region into the first region and to the second region and also for the flow of charge from the fifth region and the adjacent portion of the region of opposite conductivity through the resistance to the source of potential, and to provide a surface potential in the fifth region during the aforementioned second portion of the cycle of the second clock voltage which is energetically favorable for the flow of charge carriers from said region of opposite conductivity type to said fifth region. The time constant of the capacitance of the fifth electrode in relation to the substrate and the resistance being less than the duration of the first portion of the cycle of the second clock voltage whereby during an initial part of the aforementioned first portion of the cycle of the second clock voltage sufficient charge flows to the second region to at least equilibrate the surface potential of the second region with the first region and during the remaining part of the aforementioned first portion of the cycle of the second clock voltage excess charge flows into the adjacent portion of the region of opposite conductivity type and to said source of potential. Thus, during the aforementioned first portion of the cycle of the second clock voltage a packet of charge is developed in the second region, the magnitude of which is dependent on the magnitude of separation in potential of the signal voltage from the reference voltage in the direction favorable to the transfer of charge from the first region to the second region, and during the aforementioned second portion of the cycle of the second clock voltage the packet of charge is transferred from the second region to the fourth region.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings in which:

FIG. 3 is a diagram of voltage waveforms useful in explaining the operation of the charge transfer apparatus of the present invention;

FIG. 5 shows a modification of the apparatus of FIG. 1 and FIG. 2 in accordance with a feature of the present invention.

Figure 1:
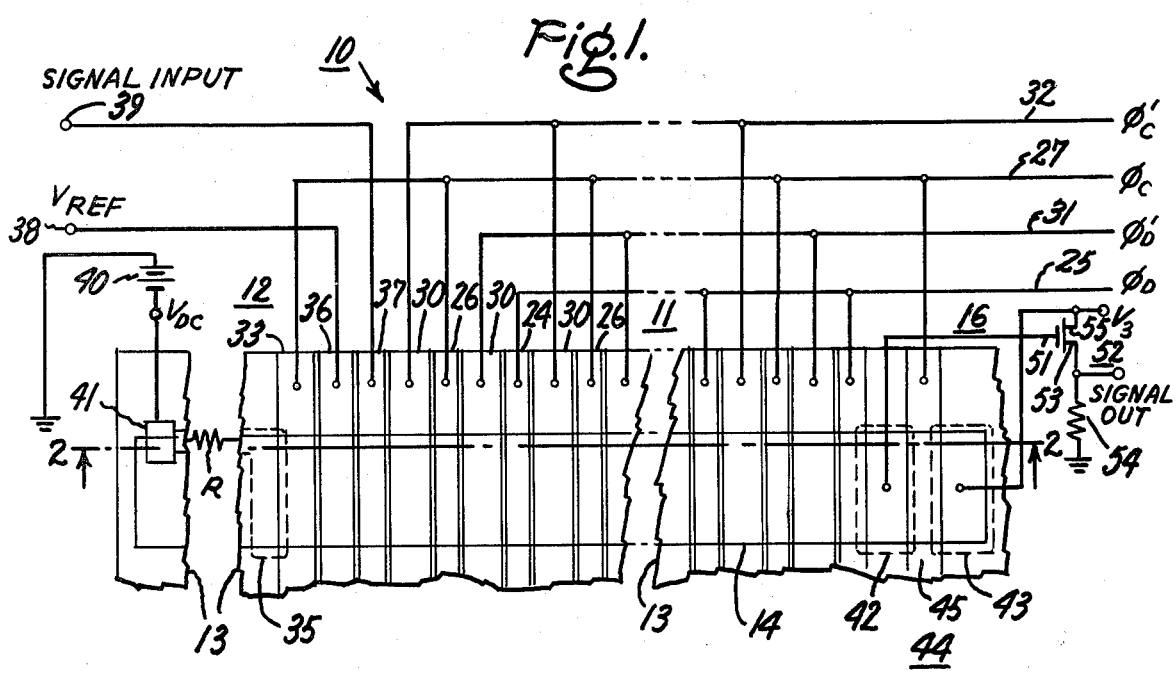
FIG. 1 is a plan view of charge transfer apparatus in the form of a charge transfer shift register incorporating the present invention.
Figure 2:
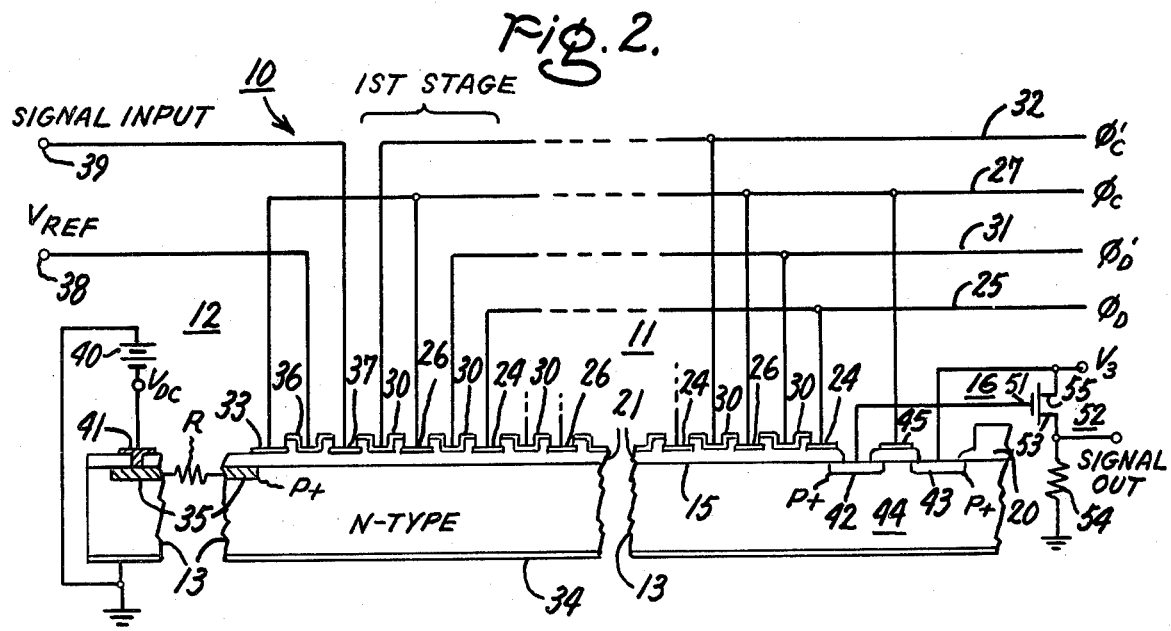
FIG. 2 is a sectional view of the apparatus of FIG. 1 taken along section lines 2—2 thereof.

Reference is now made to FIGS. 1 and 2 which show charge transfer signal processing apparatus 10 embodying the present invention. The apparatus 10, suitable for the functioning as a signal delay line for example, comprises a main section 11 including a plurality of stages, an input section 12 for converting an analog signal into packets of charge representing signal samples of the analog signal and for introducing these packets into the main section 11 and an output section. The main section 11 of the apparatus is formed on a semiconductor substrate 13 of N-type conductivity which has a channel portion 14 of uniform width adjacent a major surface 15 of the substrate. Typically, the substrate 13 may be silicon semiconductor material of 4 ohm-cm resistivity. Overlying the major surface of the substrate 13 is a thick insulating member 20 having a thin portion 21 which is of generally rectangular outline and lies in registry with the first channel portion 14 of the substrate. A first plurality of electrodes 24 are provided on the insulating member 20 overlying the thin portion 21 thereof and orthogonal to the length thereof. Each of the electrodes 24 is of uniform length in the direction of the length of the semiconductor channel portion 14 and each of the electrodes 24 extends across the thin insulating portion 21 and the bordering thick insulation portions of insulating member 20.

A second plurality of electrodes 26 are provided on the insulating member 20 overlying the thin portion 21 thereof and orthogonal to the length thereof. Each of the electrodes 26 is of uniform length in the direction of the length of the channel portion 14 and equal to the uniform length of each of the electrodes 24 of the first plurality. Each of the electrodes 26 of the second plurality are spaced between adjacent electrodes 24 of the first plurality and each extends completely over the thin insulating portion 21 of the insulating member 20 as well as the bordering thick insulation portions thereof. An insulating layer 28 is provided over the electrodes 24 and 26 of the first and second pluralities. Preferably, the first and second plurality of electrodes 24 and 26 are constituted of doped polycrystalline silicon. This material may be readily oxidized into a silicon dioxide composition which provides the insulating layer 28 over these electrodes. A plurality of transfer electrodes 30 are provided over the insulating layer 28 and the exposed portions of the thin oxide portion 21. Thus, each of the transfer electrodes 30 is insulatingly spaced between and insulatingly overlie respective adjacent electrodes 24 and 26 of the first and second pluralities. Each of the transfer electrodes 30 is of substantially uniform extent in the direction of the length of the channel portion and extends entirely over the thin insulating portion 21 of the insulating member 20 as well as the bordering thick insulating portions thereof. The transfer electrodes may be constituted of the same material as the first and second pluralities of electrodes; that is, polycrystalline silicon suitably doped to increase the conductivity thereof. Prior to the deposition of the transfer electrodes, the surface of the semiconductor substrate underlying the exposed part of the thin portion 21 of insulating member 20, the transfer electrodes is increased in conductivity by more heavily doping these surface regions with impurities, for example by ion implantation, for increasing the threshold voltages for inversion of the semiconductor surface below the transfer electrodes. Thus, with the same voltage level applied to the transfer electrodes 30 as is applied to the electrodes of the first and second pluralities, the surface potential in the substrate underlying the transfer electrodes would be greater, that is less inverted, than the surface potential underlying the electrodes of the first and second pluralities. Thus, a reduced number of voltages applied to the electrodes are required for functioning of the apparatus, as will be more fully explained below.

All of the electrodes 24 of the first plurality are connected to a common line 25 to which a $\phi_D$ voltage is applied. All of the electrodes of the second plurality are connected to a common line 27 to which a voltage $\phi_C$ is applied. All of the transfer electrodes 30 immediately preceding, that is on the left-hand side or the charge input side of the electrodes 24 of the first plurality, are connected to a common line 31 to which a $\phi_D'$ voltage is applied. These electrodes are designated as the first plurality of transfer electrodes. All of the transfer electrodes 30 located on the output side of the electrodes 24 of the first plurality, or on the input side of the electrodes 26 of the second plurality, are connected to the common line 32 to which a $\phi_C'$ voltage is applied. These transfer electrodes are designated as the second plurality of transfer electrodes. The voltages $\phi_D$, $\phi_C$, $\phi_D'$, and $\phi_C'$, applied to the lines 25, 27, 31, and 32, are shown in FIG. 3.

Figure 4A:
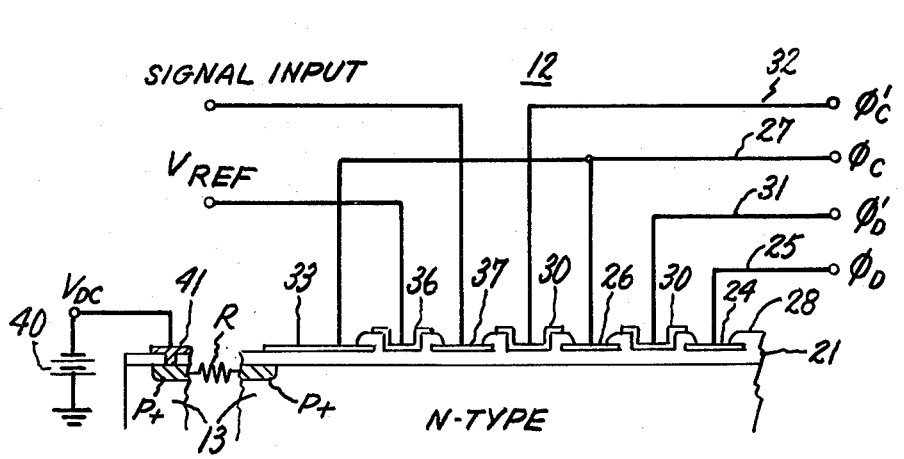
FIG. 4A is a sectional view of the charge input or sampling section of the apparatus of FIGS. 1 and 2 including a diagram of the semiconductor surface potential versus distance along the surface of semiconductor substrate useful in explaining the manner in which charge is inserted or introduced into the charge transfer shift register.

Also provided in the embodiment of FIGS. 1 and 2, and also shown in FIG. 4A, is apparatus for serially forming and inserting or introducing packets of charge into the first stage of the main section 11 of the shift register in synchronism with the clocking voltages applied to the electrodes of the shift register representing samples of an applied analog signal. The first stage of the main section 11 of the shift register comprises, in the order named, a transfer electrode 30 connected to line 32, referred to as a $\phi_C'$ electrode, a storage electrode 26 connected to line 27, referred to as a $\phi_C$ electrode, a transfer electrode 30 connected to line 31, referred to as a $\phi_D'$ electrode, and a storage electrode 24 connected to line 25, referred to as a $\phi_D$ electrode 24. The charge input section 12 includes a source of charge in the form of a P-type conductivity region 35 of elongated configuration orthogonally disposed with respect to the length of the channel portion 14 and located at the left-hand end thereof. The charge input section 12 also includes a fifth or pump electrode 33, a first or reference electrodes 36, and a second or signal electrode 37 serially arranged in the order recited between the P region 35 and the first stage of the shift register. The fifth electrode 33 overlies the thin insulating portion 21 and is shown somewhat wider than the electrodes 24 in the direction of the length of the channel portion 14. The first and second electrodes 35 and 37 overlie the thin portion 21 and are orthogonal to the length thereof. Each of the first, second and fifth electrodes extend completely over the thin insulating portion 21 of the insulating member as well as the bordering thick insulation portions thereof. The second and fifth electrodes are constituted of the same conductive material and formed at the same time as the electrodes 24 of the first plurality. The first electrode is constituted of the same material as the transfer electrodes 30 and is formed at the same time. The left-hand side of the fifth electrode 33 insulatingly overlies an adjacent portion of P region 35, and the right-hand side thereof insulatingly underlies the first electrode 36. The right-hand side of first electrode 36 insulatingly overlies the second electrode 37. The first electrode of the first stage, that is a transfer electrode 30 of the second plurality, insulatingly overlies the second electrode 37. The first electrode 36 is connected to a terminal 38 to which a reference voltage $V_{ref}$ is applied for establishing a reference surface potential in the semiconductor substrate underlying this electrode. The second electrode 37 is connected to a terminal 39 to which a analog voltage signal, commonly a bipolar signal and a d.c. bias, is applied for establishing in the semiconductor substrate underlying this electrode a surface potential varying in accordance with the amplitude of the analog voltage signal. The elongated P region 35 is of a configuration to provide a resistance R between the portion thereof adjacent to the fifth electrode 33 and another portion thereof remote from the fifth electrode 33 to which electrical terminal 41 is connected. The terminal 41 is connected to the negative terminal of a source 40 of d-c potential, the positive terminal of which is connected to ground and to substrate 13 through conductive layer 34. Conductive layer 34 is constituted of a suitable material, such as gold, and is bonded to the lower surface of the substrate 13 and forms an ohmic contact therewith. The fifth or pump electrode 33 is connected to line 27 to which a $\phi_C$ voltage is applied. The manner in which the various electrodes of the input section are biased and function to provide charge packets to the stages of the shift register in accordance with the present invention will be explained below in connection with FIGS. 4A, 4B, 4C and 4D.

There is also provided in the embodiment of FIGS. 1 and 2 an output section 16 for sensing packets of charge after they have been clocked through the shift register and developing an output therefrom. To this end regions 42 and 43 of P-type conductivity are provided spaced apart at the right-hand end of the channel portion 40 and function as the source and drain, respectively, of transistor 44. The P regions 42 and 43 are of elongated configuration with their long dimentions parallel to the width dimension of the channel portion 14. Electrode 45 is similar to electrode 26 and insulatingly overlies the part of channel portion 40 between the source and drain regions 42 and 43. Electrode 45 functions as the gate of the transistor 44. The electrode 24 of the last stage of the main section 11 of the shift register partially overlaps the P region 42. The gate electrode 45 is connected to line 27 which provides $\phi_C$ clocking voltage. The drain 43 is connected to a voltage $V_3$ which lies below the surface potential of the empty storage region underlying a $\phi_D$ electrode 24. Thus, when a storage region underlying a $\phi_C$ electrode 26 of the shift register 11 is receiving charge the transistor 44 is turned on and a precharge voltage is applied to the region 42. During the next portion of the clock cycle when charge is transferring from a storage region underlying a $\phi_C$ electrode 26 to a storage region underlying a $\phi_D$ electrode 24, the storage region underlying the $\phi_C$ electrode 26 rises in potential and enables charge to flow into the region 42 and to alter its potential in accordance with the magnitude of the charge transferred. Change in voltage on the region 42 is applied to gate 51 of transistor 52 connected as a source follower in which the source 53 is connected through a source resistance 54 to ground and the drain 55 is connected to the source of precharge voltage $V_3$. A voltage proportional to the packet of charge delivered to the precharged and floated P region 42 appears across the source resistance 54.

The manner in which packets of charge are transferred from stage to stage in the shift register 11 of FIGS. 1 and 2 will now be described in connection with the waveform diagrams of FIG. 3. Each stage of the shift register includes a $\phi_C{'}$ electrode 30, a $\phi_C$ electrode 26, a $\phi_D{'}$ electrode 30 and a $\phi_D$ electrode 24 recited in sequence in order in the direction of charge transfer in the shift register. To these electrodes are connected, respectively, the voltages $\phi_C{'}$, $\phi_C$, $\phi_D{'}$ and $\phi_D$ shown in FIG. 3. The pulse voltages $\phi_C$ and $\phi_C{'}$ are preferably identical and are supplied from a single terminal. The $\phi_C$ and $\phi_C{'}$ voltages are alternating and vary between a low potential level 45 and a high potential level 46 in respect to minority charge carriers in the substrate 13. These voltages when applied to the $\phi_C$ and the $\phi_C{'}$ electrodes produce surface potentials which vary between a high surface potential level to a low surface potential level for minority carriers in the substrate. As the threshold voltage of the $\phi_C{'}$ electrodes is higher than the threshold level of the $\phi_C$ electrodes, the surface potentials appearing under the $\phi_C{'}$ electrodes are higher than the corresponding surface potentials appearing under the $\phi_C$ electrodes for the same level of voltage applied thereto. The fixed voltages $\phi_D$ and $\phi_D{'}$ which are conveniently shown as identical produce surface potential in the substrate underlying the $\phi_D$ and the $\phi_D{'}$ electrodes which are different in view of the fact that the threshold voltages of these electrodes are different. The threshold voltage of the $\phi_D{'}$ electrodes is greater than the threshold voltage of the $\phi_D$ electrodes. Accordingly, the surface potential on the substrate underlying the $\phi_D{'}$ electrode is higher than the surface potential in the substrate underlying the $\phi_D$ electrode for minority carriers for the same level of applied voltage. The $\phi_D$ voltage is set to have a level 47 lying between the lower level 45 and upper level 46 of the $\phi_C$ voltage. The $\phi_D{'}$ voltage is also set to lie between the lower and upper levels of the $\phi_C$ voltage. At time $t_1$, the $\phi_C$ and the $\phi_C{'}$ voltages rise from the low level 45 to the high level 46 thereby providing surface potentials underlying the $\phi_C$ and the $\phi_C{'}$ electrodes which are higher than the surface potential of the regions underlying the $\phi_D$ and the $\phi_D{'}$ electrodes. As the surface potential underlying the $\phi_C{'}$ electrodes are always greater than the surface potential underlying the $\phi_C$ electrodes, charge in the $\phi_C$ storage region is inhibited from flowing in the direction of the region underlying the $\phi_C{'}$ electrodes and flows instead from left to right from the $\phi_C$ storage regions through the region underlying the $\phi_D{'}$ region into the storage region underlying the $\phi_D$ electrode. Thus, as potential of the storage regions underlying the $\phi_D$ electrodes are now lower than the potentials of the storage regions underlying the $\phi_C$ electrodes, charge can flow from the $\phi_C$ electrodes over the potential barrier underlying the $\phi_D{'}$ electrodes into the $\phi_D$ storage regions. At time $t_3$ both the $\phi_C$ and the $\phi_C{'}$ voltage drop from the upper level 46 to the lower level thereof setting the surface potentials in the surface regions underlying the $\phi_C$ electrodes at a value below the surface potential underlying the $\phi_D$ electrodes with the surface potential underlying the $\phi_D$ electrodes higher than the surface potential underlying the $\phi_C$ electrodes. Thus, during the time interval $t_3$ to $t_4$ charge from the storage regions underlying the $\phi_D$ electrodes flows into the storage regions underlying the $\phi_C$ electrodes, thereby completing a cycle of charge transfer in the shift register. In subsequent clocking cycles the cycle is repeated to cause charge to be clocked from left to right in the shift register.

Figure 4B:
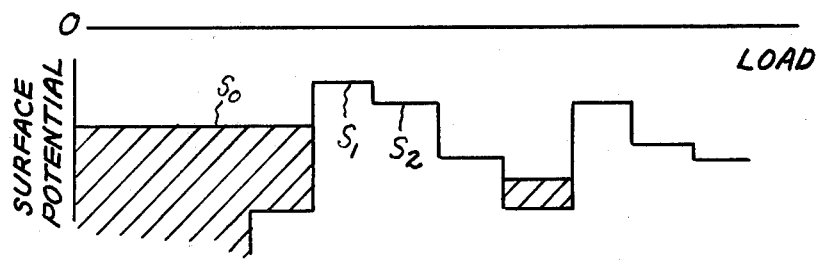
FIGS. 4B, 4C and 4D are diagrams of semiconductor surface potential versus distance along the semiconductor surface at other points in time in the cycle of forming a packet of charge for insertion into the charge transfer shift register of FIG. 4A.
Figure 4C:
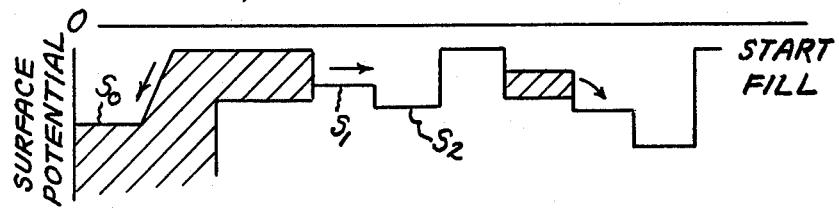
Figure 4D:
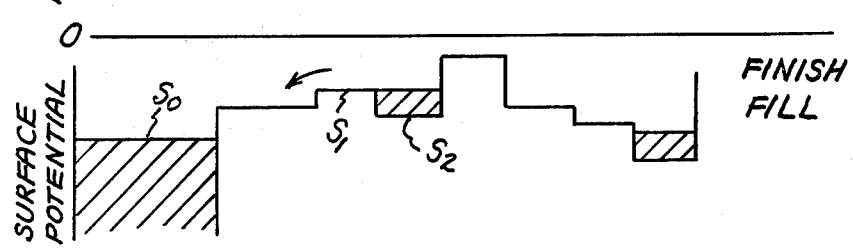

The manner in which charge is developed and transferred to the first stage of the shift register of FIGS. 1 and 2 is shown in FIGS. 4A, 4B, 4C and 4D. FIG. 4A shows a portion of the apparatus of FIG. 2 depicting the input section 12 of the apparatus including one-half of the first stage including the $\phi_C{'}$ and $\phi_C$ electrodes. The parts of the apparatus of FIG. 4A identical to the parts of the apparatus of FIG. 2 are identically designated. FIGS. 4A, 4B, 4C and 4D show the potential existing at the surface of the semiconductor substrate as a function of distance along the surface at respective successive intervals of time upon the application of the voltages of the form shown in FIG. 3, including voltages $\phi_C$, $\phi_C{'}$, $\phi_D$, $\phi_D{'}$, and also voltages $V_{DC}$ and $V_{REF}$. FIG. 4A shows the surface potential existing in the interval $t_0$ to $t_1$, referred to as the load portion of a clocking cycle during which charge is loaded into the storage region underlying the pump electrode 33. FIG. 4B also shows the surface potentials existing at time $t_1$ at the start of the interval $t_1$ to $t_2$, referred to as the "fill" portion of the clocking cycle. FIG. 4C shows the surface potentials existing at time $t_3$ in the interval $t_1$ to $t_3$, referred to as the "spill" portion of the clocking cycle. FIG. 4D shows the surface potential existing in the interval $t_3$ to $t_4$, referred to as the transfer portion of the clocking cycle, during which no further charge interchange occurs in the input section and the charge developed therein is transferred to the first stage of the shift register 11. While charge is being transferred from the second storage region underlying electrode 37 during the interval $t_3$ to $t_4$, coincidentally the storage region underlying pump electrode 33 is being loaded with charge for a succeeding sampling cycle. With the voltages $\phi_C$, $\phi_C{'}$, $\phi_D$ and $\phi_D{'}$ applied to the shift register and the voltage, $\phi_C$, $V_{DC}$ and $V_{REF}$ applied to the input section 12, the operation of the input section of the apparatus over a clock cycle is as follows. During the interval $t_0$ to $t_1$ the voltage $\phi_C$ on the pump electrode 33 is at its low level 45 which causes charge from the P region 35 to fill the fifth region with charge, as shown in FIG. 4A. At time $t_1$, the voltage $\phi_C$ on the pump electrode 33 rises to its high level and causes the fifth storage region filled with charge and also the portion of P region 35 adjacent to the fifth storage region to be raised in potential so that they exceed the surface potential of the first region underlying reference electrode 36, as shown in FIG. 4B. Thus, charge is caused to flow through the first region into the second region in which a surface potential $S_2$ has been established by applying a signal voltage to a second or signal electrode 37, and charge is also caused to flow in the opposite direction through resistance R to the source of potential 40. Accordingly, simultaneously the second storage region underlying second electrode 37 is filled with charge and charge in the fifth storage region underlying the pump electrode 33 and in the portion of P region 35 adjacent the fifth storage region flows through resistance R to the source 40. The potential of the portion of the P region 35 adjacent to the fifth storage region drops to the potential $S_0$ of the source 40 and any excess charge appearing in the second storage region spills over the potential barrier formed in the first region and through the fifth region back into the P region 35 until the surface potential in the second region equilibrates with the surface potential $S_1$ in the first region. Filling of the second region with charge starts at time $t_1$ and ends at time $t_2$ when the potential of the fifth region and the portion of P region adjacent the fifth region drops below the potential of the first region. The size of the storage region, the relative magnitudes of the pump voltage $\phi_C$ and the reference voltage $V_{REF}$, and the time constant of resistance R and the capacitance of P region 35 determine the time $t_2$ at which the potential of the fifth region drops below the potential of the first region. Preferably the time constant of resistance R and the capacitance of P region 35 is arranged to be a small fraction of the first portion, $t_1$ to $t_3$, of the sampling cycle. Spilling of charge from the second region starts essentially at time $t_2$ and ends at essentially time $t_3$ when the potential of the second region equilibrates with the first region, as shown in FIG. 4C. Time $t_1$ to $t_2$ is referred to as the "fill" interval and time $t_2$ to $t_3$ is referred to as the "spill" interval. The size of the packet of charge formed in the second region varies linearly with the difference in voltage applied to the reference electrode 36 and the signal electrode 37 and is to a first order independent of threshold voltages and temperature. Thus, a packet of charge is formed, the magnitude of which represents the amplitude of an analog signal at the instant of time substantially at $t_3$. During the second portion of the clocking cycle, the voltages $\phi_C$ and $\phi_C'$ drop to their low level and the voltage appearing on the $\phi_C'$ electrode of the first stage conveniently referred to as the third electrode and also the voltage on the $\phi_C$ electrode of the first stage conveniently referred to as the fourth electrode, also drop to their low level. Thus, the surface potentials of the regions underlying the third and fourth electrodes fall below the surface potential represented by the signal level $S_2$ and the charge packet is caused to flow from the second storage region into the fourth storage region as illustrated in FIG. 4D, thereby completing a charge sample and transfer cycle during a clocking cycle of the shift register. During the second portion of the clocking cycle, the voltage $\phi_C$ on the pump electrode 33 drops to its low level 45 below the level $S_0$ in preparation for the next sampling cycle.

Thus, a charge input structure is provided which is operative in response to a single clocking voltage to provide a "fill" part and a "spill" part in a first portion of a clocking cycle to develop a packet of charge and during a second portion of the clocking cycle to transfer the packet of charge from the input section to the first stage of a shift register or other form of charge transfer apparatus. Preferably, the time constant of the input circuit is a small fraction of the duration of the first portion of the clocking cycle so that the storage region underlying the signal electrode can be quickly filled and an adequate time allowed for equilibration and formation of a charge packet which is an accurate representation of the signal appearing on the signal electrode. This circuit does not rely on fall times of clocking cycles for the spill portion of the input cycle. With higher frequency clocking pulses, of course, the time constant of the input structure is changed so as to maintain adequate "spill" time in the first portion of the clocking cycle.

As described above, the packets of charge transferred from stage to stage of the shift register are sensed in the output circuit 16 and an output developed across resistance 54. As pointed out above the clock voltage $\phi_C$ is utilized for functioning the circuit to precharge the P region 42 during the first portion of the clocking cycle and thereafter during the second portion of the clocking cycle to float the P region 42. During the second portion of the clocking cycle, when the $\phi_C$ electrode thereof is at its high level, charge from the last stage of the shift register 11 is transferred into the floating P region 42. The resultant change in potential on the P region 42 appears at the output of the source follower 52. Thus, charge transfer apparatus is provided in which a single clocking waveform is utilized not only in the main section thereof but also in the input and output sections thereof as well, thereby greatly simplifying the fabrication thereof as well as improving the operation thereof.

FIG. 5 shows one form of integration of the resistance R on the semiconductor substrate. In this implementation the elongated P region 35 is configured in an undulating pattern between the portion thereof adjacent the fifth storage region underlying the fifth electrode 33 and the portion thereof connected to terminal 41. The resistance of the undulating portion per square and its length are set to provide the desired value of resistance R. For example, assuming a 10 megahertz clocking frequency, a desired "fill" time of about one-tenth of the period of a clocking cycle, and a fifth electrode capacitance of $2 \times 10^{-13}$ farads (corresponding to a fifth electrode area of 1 square mil and silicon dioxide dielectric thickness of 0.1 micrometer) a resistance of 50,000 ohms would be sufficient to provide a time constant of 10 nanoseconds corresponding to the desired "fill" time. This resistance could be implemented by diffused P region having an effective length of 50 squares if each square had a resistance of 1000 ohms. This impedance and higher values of impedance may alternatively be provided by the source to drain channel impedance of an integrated field effect transistor, having its source connected to terminal 41 and the portion of the P region adjacent the fifth region, underlying the fifth electrode, serving as the drain. The gate bias voltage of the integrated field effect transistor may be utilized to provide a means of altering the impedance of the channel.

While a variety of circuit means might be utilized to provide a suitable impedance between the fifth region and the bias source 40, it is important that the capacitance of such circuit means be kept to a minimum. Any excess capacitance close to the fifth region must be charged during the fill portion of the sampling cycle. This requires additional size and drive power for operation of the input section of the apparatus. For this reason it is highly desirable that low capacitance circuit means be integrated on the chip to provide this circuit means.

While the invention has been described in connection with the processing of analog signals, it is apparent that the invention is equally applicable to digital signals.

While the invention has been described in a form in which a single clocking waveform is utilized for charge transfer apparatus, it is apparent that the invention is applicable to charge transfer apparatus clocked by multiphased voltages.

While the invention has been described in connection with charged transfer apparatus including a single shift register, it is apparent that a plurality of such shift registers could be included on the same substrate and operated as desired. Also, the input structure of the invention could be utilized in charge transfer apparatus other than shift registers, for example in charge transfer apparatus such as described in U.S. Pat. No. 4,058,717 in which packets of charge are transferred in parallel to a plurality of charge storage stages and processed outputs are derived on an electrode common to all of the charge storage stages.

While the invention has been described in connection with apparatus constituted of N-type conductivity substrates P-type conductivity substrates could as well be used. Of course, in such case the applied potentials would be reversed in polarity.

While the invention has been described in specific embodiments, it will be understood that modifications, such as those described above, may be made by those skilled in the art, and it is intended by the appended claims to cover all such modifications and changes as fall within the true spirit and scope of the invention.

What is claimed is:

1. Charge transfer apparatus comprising
a semiconductor substrate of one conductivity type having a major surface,
a first electrode insulatingly overlying a first region of said substrate adjacent said major surface,
a second electrode insulatingly overlying a second region of said substrate adjacent said major surface and contiguous to said first region,
a third electrode insulatingly overlying a third region of said substrate adjacent said major surface and contiguous to said second region,
a fourth electrode insulatingly overlying a fourth region of said substrate adjacent said major surface and contiguous to said third region,
a fifth electrode insulatingly overlying a fifth region of said substrate adjacent said major surface and contiguous to said first region,
a region of opposite conductivity type in said major surface having a portion adjacent to said fifth region,
means for applying a reference voltage to said first electrode to establish a surface potential in said first region corresponding to said reference voltage,
means for applying a signal voltage to said second electrode to establish a surface potential in second region corresponding to said signal voltage,
means for applying a first clock voltage to said third electrode to establish a surface potential in said third region corresponding to said first clock voltage,
means for applying a second clock voltage to said fourth electrode to establish a surface potential in said fourth region corresponding to said second clock voltage,
said second clock voltage having a first value over a first portion of a cycle thereof which is unfavorable for the transfer of charge from said second region to said fourth region and having a second value over a second portion of said cycle which is favorable for the transfer of charge from said second region to said fourth region,
said first clock voltage having a first value during said first portion of said cycle of said second clock voltage which inhibits the transfer of charge from said second region to said fourth region and having a second value during said second portion of said cycle of said second clock voltage which enables the transfer of charge from said second region to said fourth region,
means for connecting said adjacent portion of said region of opposite conductivity type through a resistance to a source of potential unfavorable for the transfer of charge from said region of opposite conductivity type to said first region,
means for applying said second clock voltage to said fifth electrode to provide a surface potential in said fifth region and said adjacent portion of said region of opposite conductivity type during said first portion of said cycle of said second clock voltage energetically favorable for the flow of charge from said fifth region into said first region and to said second region and also for the flow of charge from said fifth region and said adjacent portion of said region of opposite conductivity through said resistance to said source of potential, and to provide a surface potential in said fifth region during said second portion of said cycle of said second clock voltage which is energetically favorable for the flow of charge carriers from said region of opposite conductivity type to said fifth region,
the time constant of the capacitance of said fifth electrode in relation to said substrate and said resistance being less than the duration of said first portion of said cycle of said second clock voltage whereby during an initial part of said first portion of said cycle of said second clock voltage sufficient charge flows to said second region to at least equilibrate the surface potential of said second region with said first region and during the remaining part of said first portion of said cycle of said second clock voltage excess charge flows into said adjacent portion of said region of opposite conductivity type,
whereby during said first portion of said second clock voltage a packet of charge is developed in said second region, the magnitude of which is dependent on the magnitude of separation in potential of said signal voltage from said reference voltage in the direction favorable to the transfer of charge from said first region to said second region, and during said second portion of said cycle of said second clock voltage said packet of charge is transferred from said second region to said fourth region.

2. The apparatus of claim 1 in which said first clock voltage and said second clock voltage are identical.

3. The apparatus of claim 1 in which said resistance is integrated on said substrate.

4. The apparatus of claim 3 in which said resistance is the source to drain resistance of a suitably biased field effect transistor.

5. The apparatus of claim 1 in which said signal is an analog signal.

6. The apparatus of claim 1 in which said third and fourth electrodes comprise a stage of charge storage and transfer channel.

* * * * *